(12) United States Patent
Burkett

(10) Patent No.: US 11,003,806 B2
(45) Date of Patent: May 11, 2021

(54) USING SCANNED VANES TO DETERMINE EFFECTIVE FLOW AREAS

(71) Applicant: Rolls-Royce Engine Services Oakland, Inc., Oakland, CA (US)

(72) Inventor: Bradley W. Burkett, Livermore, CA (US)

(73) Assignee: Rolls-Royce Engine Services Oakland, Inc., Oakland, CA (US)

( * ) Notice: Subject to any disclaimer, the term of this patent is extended or adjusted under 35 U.S.C. 154(b) by 179 days.

(21) Appl. No.: 16/417,038

(22) Filed: May 20, 2019

(65) Prior Publication Data

US 2020/0026821 A1 Jan. 23, 2020

Related U.S. Application Data

(63) Continuation of application No. 14/995,781, filed on Jan. 14, 2016, now Pat. No. 10,339,264.

(51) Int. Cl.
*G06F 30/17* (2020.01)
*F01D 21/00* (2006.01)
(Continued)

(52) U.S. Cl.
CPC .............. *G06F 30/17* (2020.01); *F01D 9/041* (2013.01); *F01D 21/003* (2013.01); *G01B 11/24* (2013.01);
(Continued)

(58) Field of Classification Search
CPC ...... G06F 17/5086; G06F 30/17; F01D 9/041; F01D 21/003; G01B 11/24; F05D 2260/81; F05D 2260/80; F05D 2270/8041
(Continued)

(56) References Cited

U.S. PATENT DOCUMENTS 3,732,031 A 5/1973 Bowling et al.
3,957,104 A 5/1976 Terpay
(Continued)

FOREIGN PATENT DOCUMENTS

JP 2002221006 8/2002
JP 2003097217 4/2003
(Continued)

OTHER PUBLICATIONS

Extended European Search Report, European Application No. 17151332.8, dated Jul. 12, 2017, 6 pages.
(Continued)

*Primary Examiner* — Juan C Ochoa
(74) *Attorney, Agent, or Firm* — Barnes & Thornburg LLP

(57) ABSTRACT

A computing device for determining effective flow areas of a turbine or turbine engine includes optically scanning and digital modeling of turbine components to produce virtual vanes, virtual vane segments, and virtual ring assemblies. The computing device determines both individual effective flow areas between vanes and the total effective flow area of a vane ring assembly. Based on the virtual vanes and determined effective flow areas, the computing device may compare one or more turbine components to a reference turbine to determine whether the turbine is out of specification and aid in repair, modification, or reassembly of the turbine or turbine engine.

20 Claims, 5 Drawing Sheets

(51) Int. Cl.
*G01B 11/24* (2006.01)
*F01D 9/04* (2006.01)

(52) U.S. Cl.
CPC ...... *F05D 2260/80* (2013.01); *F05D 2260/81* (2013.01); *F05D 2270/8041* (2013.01)

(58) Field of Classification Search
USPC .............................................. 703/6, 7, 8, 2, 1
See application file for complete search history.

(56) References Cited

U.S. PATENT DOCUMENTS

| | | | |
|---|---|---|---|
| 4,222,172 | A | 9/1980 | Mason |
| 4,374,459 | A | 2/1983 | Burton |
| 4,555,798 | A | 11/1985 | Bradbent, Jr. et al. |
| 4,896,430 | A | 1/1990 | Burton |
| 4,908,782 | A | 3/1990 | Pekarek et al. |
| 5,291,654 | A | 3/1994 | Judd et al. |
| 5,545,003 | A | 8/1996 | O'Connor et al. |
| 6,148,677 | A * | 11/2000 | Evangelista ........... G01B 21/28 137/14 |
| 6,582,194 | B1 | 6/2003 | Birkner et al. |
| 6,654,710 | B1 | 11/2003 | Keller |
| 6,923,051 | B2 | 8/2005 | Fleming |
| 6,945,124 | B1 | 9/2005 | Leboeuf et al. |
| 6,992,315 | B2 | 1/2006 | Twerdochlib |
| 7,116,839 | B2 | 10/2006 | Leboeuf et al. |
| 7,305,118 | B2 | 12/2007 | Leboeuf et al. |
| 7,441,331 | B2 | 10/2008 | Hudson et al. |
| 7,640,793 | B2 | 1/2010 | McCall et al. |
| 7,656,445 | B2 | 2/2010 | Heyworth |
| 7,668,704 | B2 | 2/2010 | Perchanok et al. |
| 7,774,171 | B2 | 8/2010 | Chou et al. |
| 7,784,183 | B2 | 8/2010 | Rockstroh et al. |
| 7,791,025 | B2 | 9/2010 | Key |
| 8,602,722 | B2 | 12/2013 | George et al. |
| 8,937,628 | B2 | 1/2015 | Hatcher et al. |
| 9,030,667 | B2 | 5/2015 | Tanriverdi |
| 9,116,071 | B2 | 8/2015 | Hatcher et al. |
| 2003/0216856 | A1 | 11/2003 | Jacobson |
| 2003/0228069 | A1 | 12/2003 | Leboeuf |
| 2006/0087662 | A1 | 4/2006 | Lefoeuf et al. |
| 2007/0050156 | A1 | 3/2007 | Vaidyanathan |
| 2009/0164185 | A1 | 6/2009 | Menuey |
| 2010/0300642 | A1 | 12/2010 | Didion |
| 2011/0052370 | A1* | 3/2011 | Karpman ............... F01D 21/003 415/13 |
| 2011/0139915 | A1 | 6/2011 | Didion |
| 2011/0229307 | A1 | 9/2011 | Lemieux et al. |
| 2012/0087803 | A1 | 4/2012 | Bulter et al. |
| 2014/0142889 | A1 | 5/2014 | Chuong |
| 2014/0376589 | A1 | 12/2014 | Karp et al. |
| 2015/0308337 | A1 | 10/2015 | Marasco et al. |

FOREIGN PATENT DOCUMENTS

| | | |
|---|---|---|
| JP | 2005534002 | 11/2005 |
| JP | 2007024597 | 2/2007 |
| JP | 2007064218 | 3/2007 |
| JP | 2008517282 | 5/2008 |
| JP | 2011179493 | 9/2011 |
| JP | 2015007425 | 1/2015 |
| WO | 2006042397 A1 | 4/2006 |

OTHER PUBLICATIONS

European Office Action, dated Jul. 30, 2019 in connection with European Application No. 17151332.8, 4 pages.
Japanese Office Action for Application No. 2017-003411, 7 pages.

* cited by examiner

USING SCANNED VANES TO DETERMINE EFFECTIVE FLOW AREAS

CROSS REFERENCE TO RELATED APPLICATIONS

This application claims priority to and the benefit of U.S. Provisional patent application Ser. No. 14/995,781, filed 14 Jan. 2016, the disclosure of which is now expressly incorporated herein by reference.

FIELD OF THE DISCLOSURE

The present disclosure relates generally to the use of optical scanning in the prediction of effective flow areas. Additionally, the present disclosure relates to the use of optical scanning of vanes to determine effective flow areas for turbine engines.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Products of the combustion reaction in the combustor are directed into the turbine where work is extracted to drive the compressor and, sometimes, an output shaft. Left-over products of the combustion are exhausted out of the turbine and may provide thrust in some applications.

Compressors and turbines typically include alternating stages of static vane assemblies and rotating wheel assemblies. The rotating wheel assemblies include disks carrying blades around their outer edges. When the rotating wheel assemblies turn, tips of the blades move along blade tracks included in static shrouds that are arranged around the rotating wheel assemblies. Such static shrouds may be coupled to an engine case that surrounds the compressor, the combustor, and the turbine.

The vane assemblies may have a total effective flow area that can be determined by adding individual effective flow areas from individual vane segments. The individual vane segments may each have different effective flow areas based on, for example, different manufacturing tolerances or exposure to stress or temperature during operation. For example, a vane's effective flow area may be lessened due to its exposure to the temperature and products of the combustion reaction in the combustor.

SUMMARY

The present disclosure may comprise one or more of the following features and combinations thereof.

A computing device for determining an effective flow area of a first vane for a turbine or a turbine engine may include at least one computing device and instructions embodied in one or more non-transitory machine accessible storage media, the instructions executable by the at least one computing device to cause the computing device to determine an effective flow area of the first vane for the turbine by optically scanning the first vane, creating a virtual vane based on the scan, determining at least one chokepoint of the virtual vane, and calculating a virtual vane effective flow area based at least in part on the at least one chokepoint.

In some embodiments, a computing device for determining an effective flow area of a vane ring for a turbine engine may include at least one computing device and instructions embodied in one or more non-transitory machine accessible storage media, the instructions executable by the at least one computing device to cause the computing device to determine an effective flow area of a vane ring for a turbine engine by: scanning a vane ring that includes a plurality of vanes; based on the scan, creating a virtual vane ring comprising a plurality of virtual vanes corresponding to each of the plurality of vanes; determining at least one chokepoint for each of the plurality of virtual vanes; calculating an individual effective flow area of each of the plurality of virtual vanes based at least in part on the at least one chokepoint; and calculating a vane ring effective flow area by calculating a sum of the individual effective flow areas.

These and other features of the present disclosure will become more apparent from the following description of the illustrative embodiments.

BRIEF DESCRIPTION OF THE DRAWINGS

This disclosure is illustrated by way of example and not by way of limitation in the accompanying figures. The figures may, alone or in combination, illustrate one or more embodiments of the disclosure. Elements illustrated in the figures are not necessarily drawn to scale. Reference labels may be repeated among the figures to indicate corresponding or analogous elements.

DETAILED DESCRIPTION OF THE DRAWINGS

Figure 1:
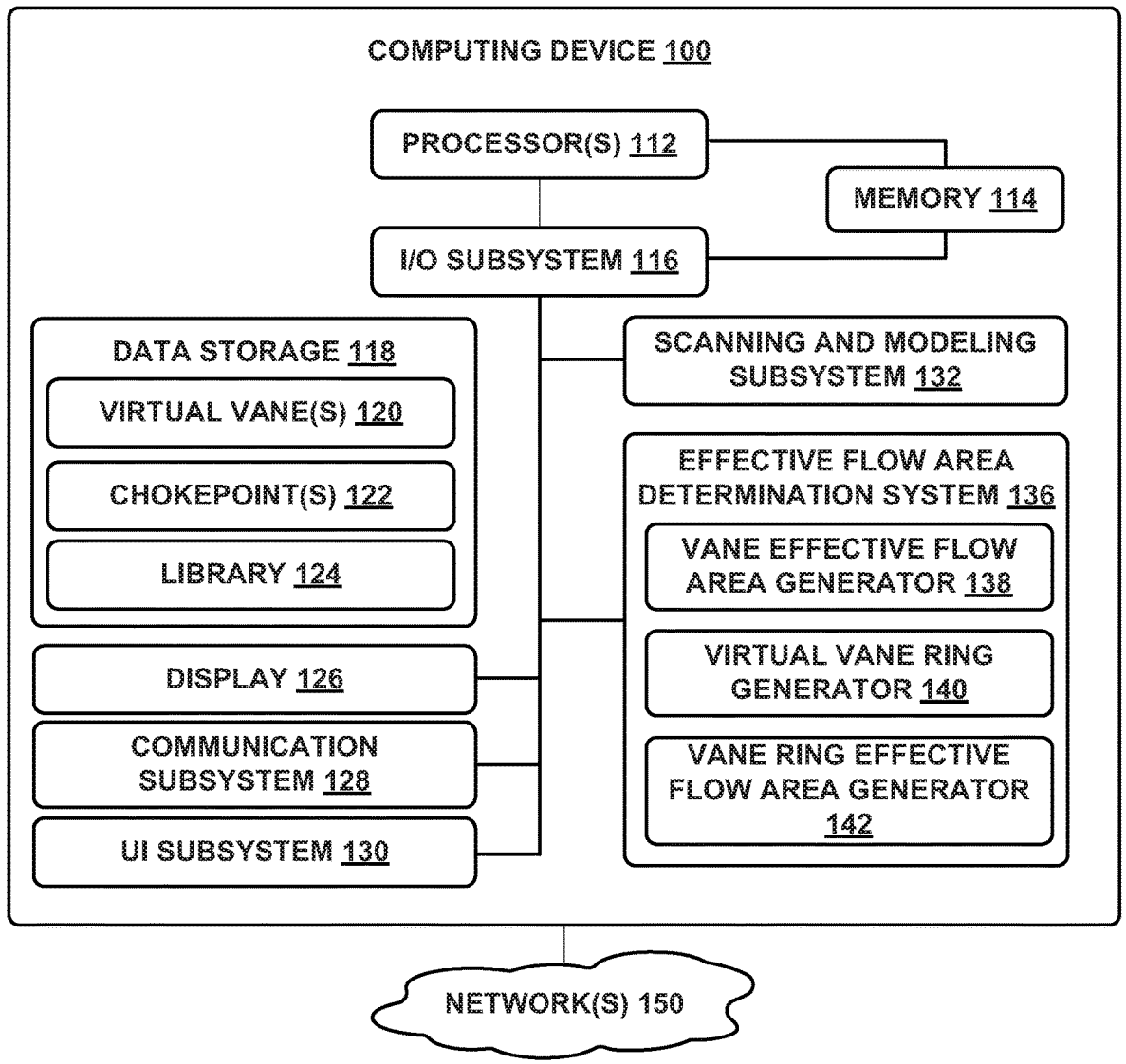
FIG. 1 is a simplified block diagram of at least one embodiment of a computing device for determining effective flow areas as disclosed herein.

For the purposes of promoting an understanding of the principles of the disclosure, reference will now be made to a number of illustrative embodiments illustrated in the drawings and specific language will be used to describe the same.

Referring now to FIG. 1, an embodiment of a computing device 100 for determining effective flow areas is shown. The illustrative computing device 100 includes at least one computing device 100, which has embodied therein a scanning and modeling subsystem 132 and an effective flow area determination system 136. As described in more detail below, the scanning and modeling subsystem 132 may create one or more virtual vanes or virtual vane segments by optically scanning one or more vanes of a turbine or turbine engine. The effective flow area determination system 136 may determine one or more effective flow areas of individual vanes or vane segments and may also determine a total effective flow area for the turbine or turbine engine.

The computing device 100 may include hardware, firmware, and/or software components that are configured to perform the functions disclosed herein, including the functions of the scanning and modeling subsystem 132 and the effective flow area determination system 136. While not specifically shown, the computing device 100 may include other computing devices (e.g., servers, mobile computing devices, etc.) which may be in communication with each other and/or the computing device 100 via one or more communication networks to perform one or more of the disclosed functions.

The illustrative computing device 100 may include at least one processer 112 (e.g., a controller, microprocessor, microcontroller, digital signal processor, etc.), memory 114, and an input/output (I/O) subsystem 116. The computing device 100 may be embodied as any type of computing device (e.g., a tablet computer, smart phone, body-mounted device or wearable device, etc.), a server, an enterprise computer system, a network of computers, a combination of computers and other electronic devices, or other electronic devices.

Although not specifically shown, it should be understood that the I/O subsystem 116 typically includes, among other things, an I/O controller, a memory controller, and one or more I/O ports. The processor 112 and the I/O subsystem 116 are communicatively coupled to the memory 114. The memory 114 may be embodied as any type of suitable computer memory device (e.g., volatile memory such as various forms of random access memory.

The I/O subsystem 116 is communicatively coupled to a number of hardware, firmware, and/or software components, including a data storage device 118, a display 126, a communication subsystem 128, a user interface (UI) subsystem 130, the scanning and modeling subsystem 132, and the effective flow area determination system 136. The data storage device 118 may include one or more hard drives or other suitable persistent storage devices (e.g., flash memory, memory cards, memory sticks, and/or others). The virtual vane(s) 120, chokepoint(s) 122, and library 124 reside at least temporarily in the data storage device 118 and/or other data storage devices of the computing device 100 (e.g., data storage devices that are "in the cloud" or otherwise connected to the computing device 100 by a network). Portions of the scanning and modeling subsystem 132 and the effective flow area determination system 136 may be copied to the memory 114 during operation of the computing device 100, for faster processing or for other reasons. The display 126 may be embodied as any type of digital display device, such as a liquid crystal display (LCD), and may include a touchscreen. The illustrative display 126 is configured or selected to be capable of displaying two- and/or three-dimensional graphics.

The communication subsystem 128 may communicatively couple the computing device 100 to other computing devices and/or systems by, for example, one or more network(s) 150. The network(s) 150 may be embodied as, for example, a cellular network, a local area network, a wide area network (e.g., Wi-Fi), a personal cloud, a virtual personal network (e.g., VPN), an enterprise could, a public could, an Ethernet network, and/or a public network such as the Internet. The communication subsystem 128 may, alternatively or additionally, enable shorter-range wireless communications between the computing device 100 and other computing devices, using, for example, BLUETOOTH and/or Near Field Communication (NFC) technology. Accordingly, the communication subsystem 128 may include one or more optical, wired, and/or wireless network interface subsystems, cards, adapters, or other devices, as may be needed pursuant to the specifications and/or design of the particular computing device 100. The user interface subsystem 130 may include one or more user input devices (e.g., the display 126, a microphone, a touchscreen, keyboard, virtual keypad, etc.) and one or more output devices (e.g., audio speakers, LEDs, additional displays, etc.).

The communication subsystem 128 may communicate output of one or more of the scanning and modeling subsystem 132 and the effective flow area determination system 136. For example, portions of virtual vanes 120, chokepoint(s), 122, or libraries 124 may be supplied to other computing devices via network(s) 150.

The scanning and modeling subsystem 132 may be embodied as one or more computer-executable components and data structures for performing optical scanning and finite element modeling of a manufactured component, such as vanes of a turbine or turbine engine. The illustrative scanning and modeling subsystem 132 may create a virtual and mathematical model of structural characteristics of the component. For example, the scanning and modeling subsystem 132 may receive an optical scan of a vane component. The optical scan may be performed using various methods, such as laser scanning and/or precision structure light scanning with blue and/or white lights. By using a high resolution optical scanning process, the scanning and modeling subsystem 132 can produce a more precise virtual model of the component with better definition of subtle edge features. This is beneficial because the vanes may be deformed or disfigured during manufacturing, during transit, or during operation such that the effective flow area of individual vanes, a vane segment, or a vane ring is negatively impacted. Once a component is identified as having a negatively impacted effective flow area, that component can be monitored, repaired, or replaced to mitigate turbine issues during operation (e.g., vibration) or to improve turbine characteristics (e.g., fuel efficiency).

In some embodiments, the scanning and modeling subsystem 132 may scan the individual vanes of the turbine or turbine engine using a structured blue light scan. In some embodiments, the scan may include a scan of substantially the entire flow area surface of the vanes; for example, by performing both a full part scan of the vane. The full part scan may include performing both a front scan of the vane and a back scan of the vane. The full part scan of the vane ensures the scan captures a better definition of the subtle edge features of the vanes, as well as any datum surfaces that may be used to fit the scanned vanes into a simulated or virtual ring.

In some embodiments, the scanning and modeling subsystem 132 may identify chokepoint(s) 122 of the vane. Chokepoint(s) 122 may be areas or points of a vane that may restrict the effective flow area between vanes. The chokepoint(s) 122 may be stored as part of the virtual vane(s) 120 in library 124 of data storage 118 of the computing device 100. In some embodiments, identification of chokepoint(s) 122 may be performed via other parts of the computing device 100, such as the effective flow area determination system 136.

The effective flow area determination system 136 may be embodied as one or more computer-executable components and data structures for determining effective flow areas between one or more components, including a vane effective flow area generator 138, a virtual vane ring generator 140, and a vane ring effective flow area generator 142. The illustrative effective flow area determination system 136 may use the virtual and mathematical model of structural characteristics of the components from the scanning and modeling subsystem 132 to determine one or more effective flow areas between those components.

In some embodiments, a vane effective flow area generator 138 may generate a vane segment, based on two virtual vanes 120 scanned and modeled by the computing device 100. The vane segment may include chokepoint(s) 122. Based at least in part on the chokepoint(s) 122, the vane effective flow area generator 138 may calculate a vane effective flow area. In some embodiments, the vane effective flow area of the vane segment may be calculated mathematically by determining the area between two virtual vanes 120. This calculation may take into account the chokepoint(s) 122 in determining the vane effective flow area. The vane effective flow area generator 138 may determine the effective flow area for each area in between the virtual vane(s) 120.

In some embodiments, a virtual vane ring generator 140 may generate a virtual vane ring that includes each of the virtual vanes 120. The illustrative virtual vane ring generator 140 may use the virtual and mathematical model of structural characteristics of the vane components from the scanning and modeling subsystem 132 to assemble the virtual vane ring. Once the virtual vane ring is assembled, the vane ring effective flow area generator 142 may calculate a vane ring effective flow area for the entire turbine or turbine engine. In some embodiments, the vane ring effective flow area generator 142 may calculate the vane ring effective flow area by adding the determined vane effective flow areas.

The computing device 100 and instructions embodied thereon for determining effective flow areas of components of a turbine and/or of the entire vane ring assembly of a turbine or turbine engine may be used both in initial manufacturing and repair and reassembly. In some embodiments, the systems and methods described herein may be used during initial production to verify effective flow areas of a turbine or turbine engine. In other embodiments, the systems and methods described herein may be used during repair or reassembly to verify, modify, or repair components of a turbine or turbine engine based on one or more of the determined effective flow areas.

Particular aspects of the systems, devices, methods, and analyses that may be performed by the various modules of the computing device 100 may vary depending on one or more of the characteristics of the component being analyzed or its prescribed mission criteria. Accordingly, the examples described herein are illustrative and intended to be non-limiting. Further, the computing device 100 may include other components, sub-components, and devices not illustrated in FIG. 1 for clarity of the description. In general, the components of the computing device 100 are communicatively coupled as shown in FIG. 1 by electronic signal paths, which may be embodied as any type of wired or wireless signal paths capable of facilitating communication between the respective devices and components.

Figure 2:
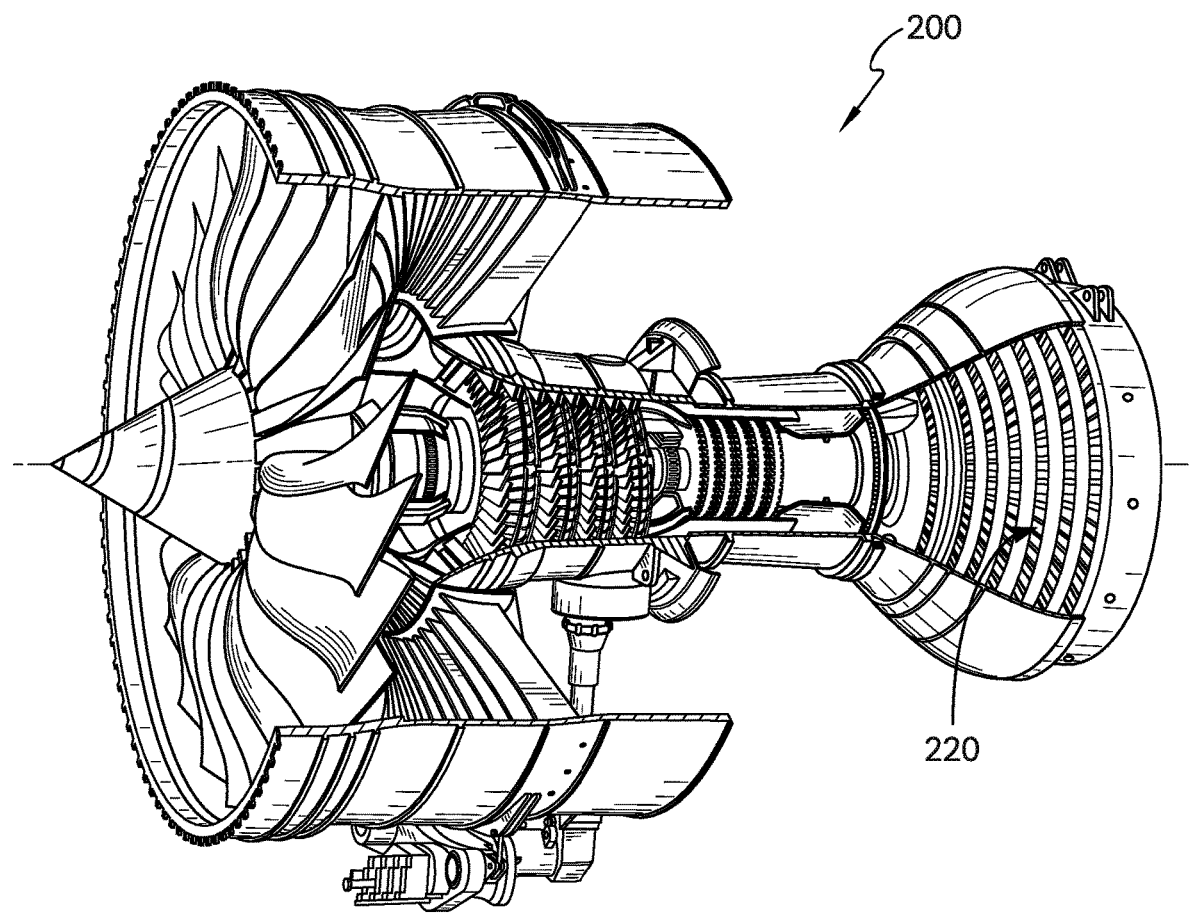
FIG. 2 illustrates a simplified perspective view of at least one embodiment of a gas turbine engine system including vanes, with portions of the casing cut away.

FIG. 2 illustrates a simplified perspective view of at least one embodiment of a gas turbine engine system including vanes, with portions of the casing cut away. As illustrated in FIG. 2, the gas turbine engine system 200 may include a plurality of vanes 220. From FIG. 2, it can be seen that disclosed embodiments provide technical utility by being configured to scan both sides of the vanes 220 to determine where chokepoints exist such that the effective flow area can be more accurately determined.

Figure 3B:
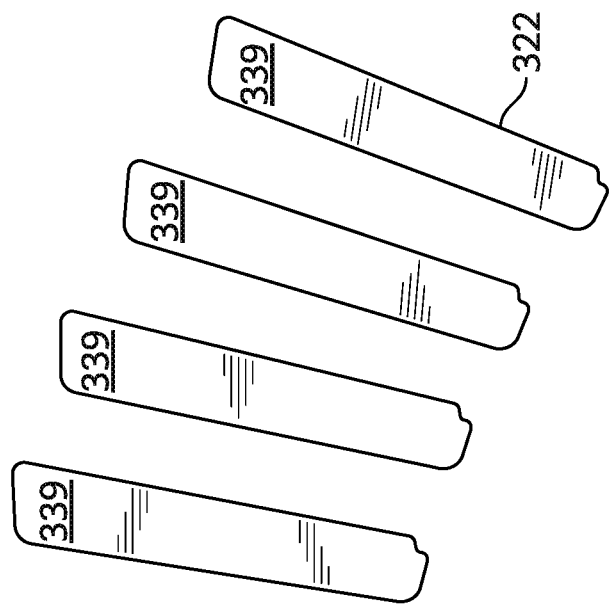
FIG. 3B illustrates a effective flow areas of the virtual vane segment of FIG. 3A.
Figure 3A:
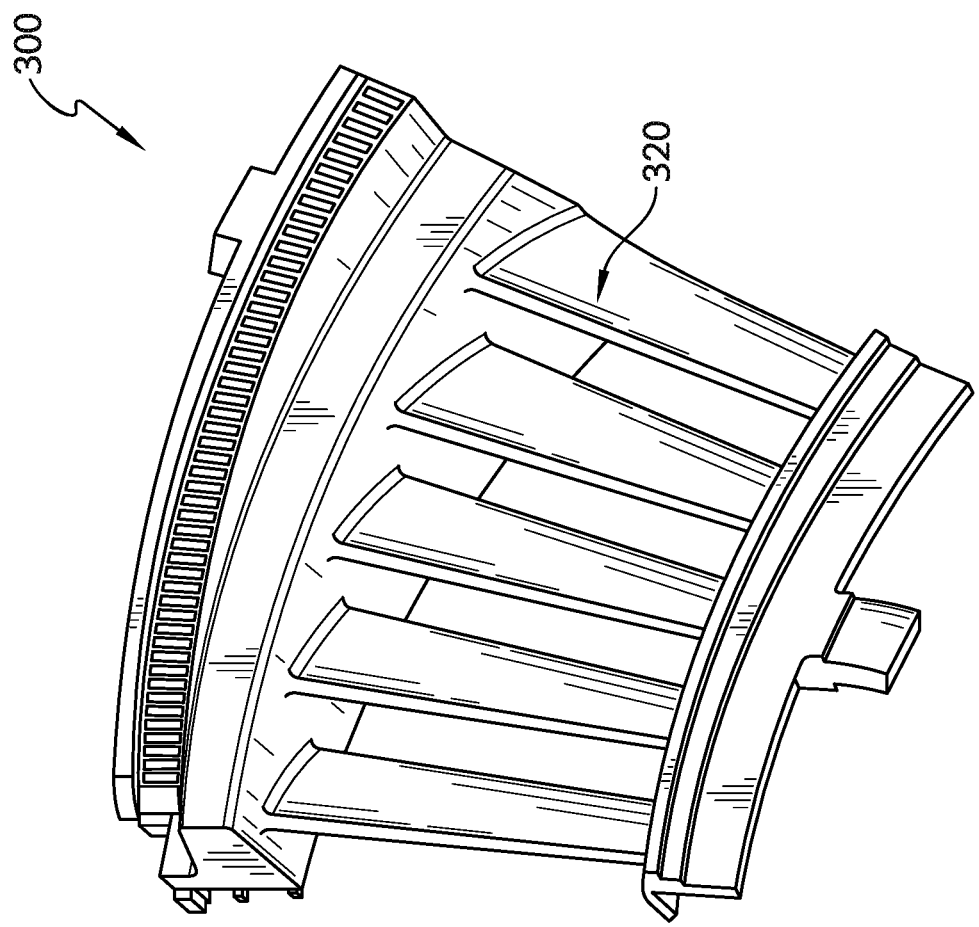
FIG. 3A illustrates a virtual vane segment according to at least one embodiment.

Referring now to FIG. 3A, a virtual vane segment 300 is shown according to at least one embodiment. The virtual vane segment 300 may include virtual vanes 320. In FIG. 3B, effective flow areas 339 of the virtual vane segment 300 and a chokepoint 322 are shown. By scanning the front and back of the vane 320, the chokepoints 322 can be identified regardless of how far back on the trailing edge or leading edge of the vane 320 the chokepoint 322 is positioned. This provides additional technical utility because it provides more accuracy to the determination of the effective flow areas 339.

FIG. 3B illustrates four example virtual vanes 320 that have very few defects. In other words, the edges of the virtual vanes 320 are substantially straight. These examples are provided for reference only. In some embodiments, such as after vanes have been in operation, multiple deviations may exist on the actual vane such that the edges of the virtual vane 320 are not uniform.

For ease of illustration and clarity, three sections were used to create the chokepoint 322 to determine the effective flow area 339 in FIG. 3B. However, depending on the vane model one or more sections may be used to create chokepoints. In some embodiments, a minimum of three sections may be used to create a chokepoint. The sections may be used to calculate one or more chokepoint measurements between airfoils. Using FIG. 3B as an example, after all four of the chokepoints 322 (although only one chokepoint 322 is shown in FIG. 3B, each of the four virtual vanes 320 are identical in this illustration and would have a chokepoint 322 at the same location) have been calculated they can be used to determine the effective flow area 339 for that vane segment 300. This provides additional technical utility in increased accuracy of the virtual vane construction and the resultant effective flow area determinations.

Figure 4:
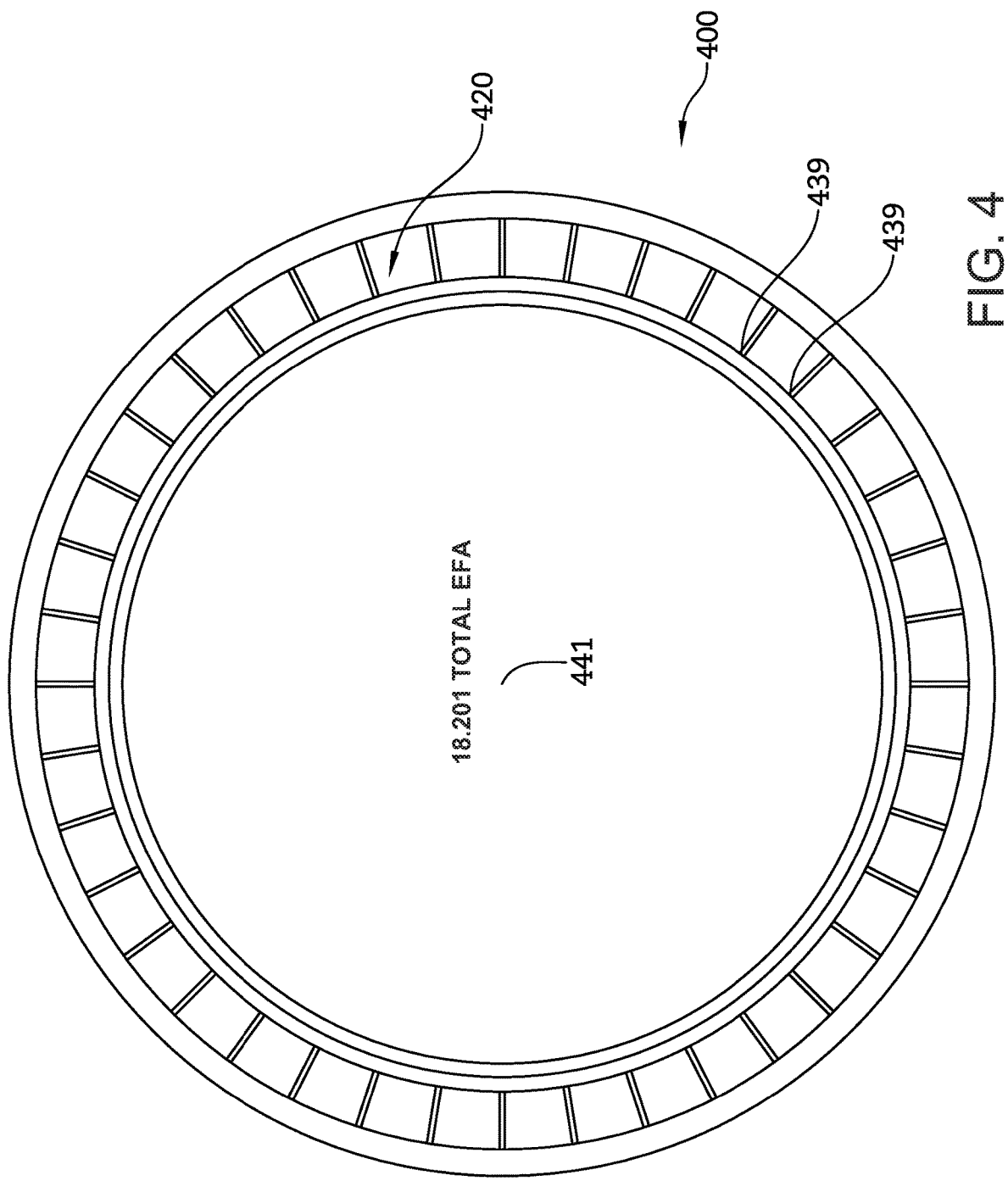
FIG. 4 illustrates a virtual vane ring assembly according to at least one embodiment.

FIG. 4 illustrates an example of an entire virtual vane ring assembly 400 according to at least one embodiment. The virtual vane ring assembly 400 includes a plurality of vanes 420, a plurality of vane effective flow areas 439, and a display of the vane ring effective flow area 441. The vane ring effective flow area 441 may be the sum of the individual effective flow areas 439. In some embodiments, such as initial testing of a turbine or maintenance of a turbine, the virtual vane ring is beneficial in identifying both the overall effective flow area of an entire vane ring and the individual effective flow areas. Any anomalies or outliers in individual effective flow areas can also be identified. In some embodiments, one or more of the virtual vanes 420 may be removed for repair or modification, re-scanned and re-modeled (e.g., via the scanning and modeling subsystem 132), and re-inserted into the virtual vane ring assembly with an updated effective flow area (e.g., as generated by the virtual vane ring generator 140 and calculated by the effective flow area determination system 136).

In some embodiments, a turbine or turbine engine may have reference specifications that indicate acceptable ranges for various components or characteristics. For example, a reference turbine or turbine engine may have an acceptable range for the total effective flow area and/or individual effective flow areas for that particular turbine or turbine engine make or model.

Referring back to FIG. 1, the computing device 100 may have further technical utility by being used to compare one or more aspects of reference specifications of a turbine or turbine engine to one or more components or aspects of the scanned and modeled components. For example, the computing device 100 may be used to compare the vane ring effective flow area 441 to a reference vane ring effective flow area or individual vane effective flow areas 439 to reference individual vane effective flow areas.

In some embodiments, if the computing device 100 detects a component or aspect of the turbine or turbine that is out of specification, it may take one or more actions. For example, the computing device 100 may use one or more of its I/O subsystem 116, display 126, communication subsystem 128, UI subsystem 130, or other components or processes to alert a user that the computing device 100 has detected a component or aspect that is out of specification. In some embodiments, the alert may be a visual alert on the display 126 or the I/O subsystem 116 (e.g., blinking LED lights), an audio alert from a speaker that is part of the I/O subsystem 116, and/or the alert may be an email, text message, or other communication sent via the communication system 128 or network(s) 150.

Figure 5:
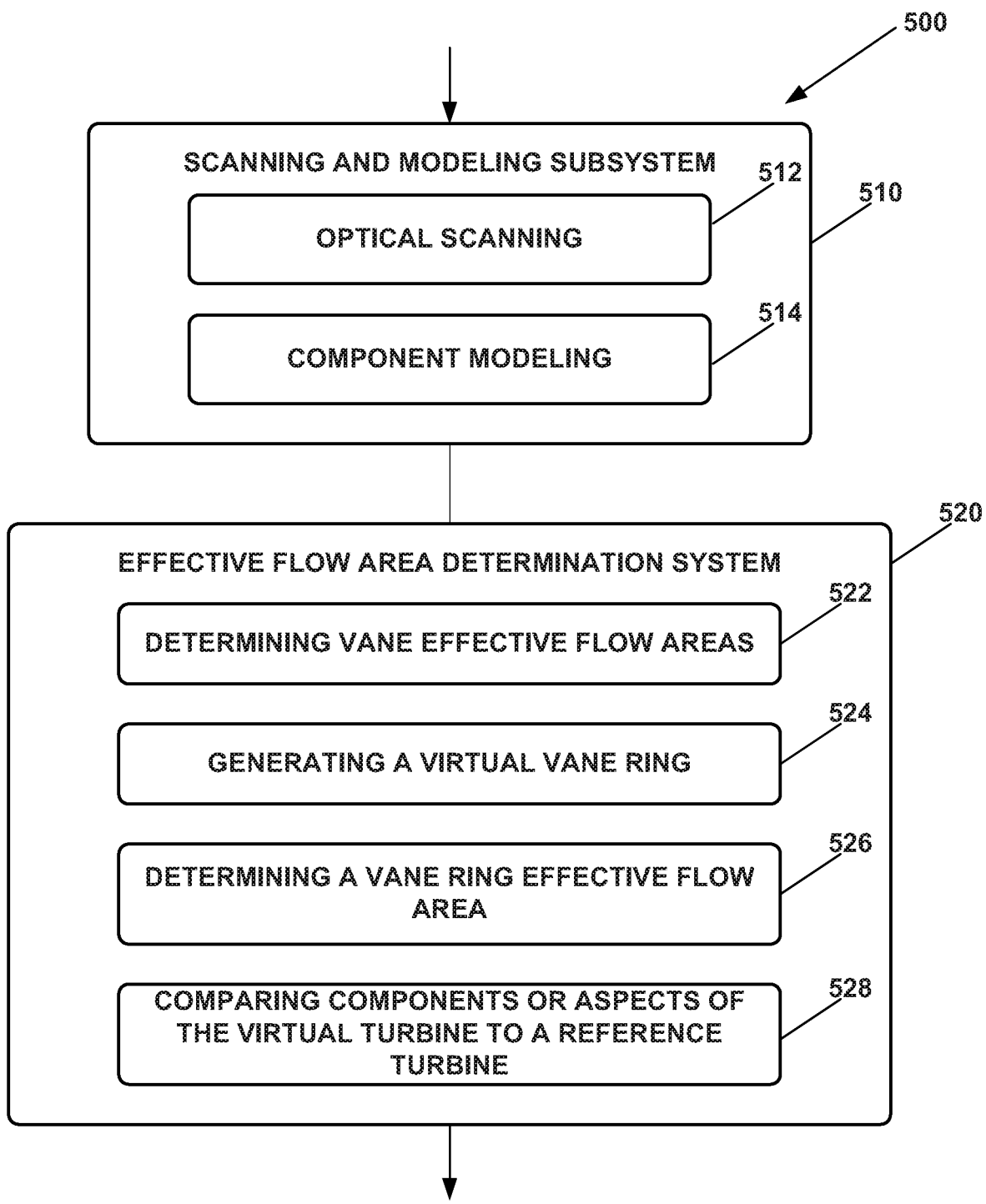
FIG. 5 is a simplified flow diagram of at least one embodiment of a method for determining effective flow areas, which may be executed by the computing device of FIG. 1.

Referring now to FIG. 5, an illustrative method 500 for determining an effective flow area of a turbine or turbine engine is shown. Aspects of the method 500 may be embodied as computerized programs, routines, logic, and/or instructions executed by the computing device 100, for example by one or more of the modules 132, 136, 138, 140, and 142. At 510, the computing device may scan and model components of a turbine, for example, as previously described herein. At 512, the computing device may optically scan individual components such as vanes, including front scans and back scans, using blue light scanning or other high resolution processes. At 514, the computing device may create virtual vanes that are digital representations of structural vane components of the turbine or turbine engine. Those virtual vanes may include one or more chokepoints, which the computing device may identify as chokepoints for the virtual model. The virtual vanes, chokepoints, and other aspects of the scanned and modeled components may be stored in a library as explained above.

At 520, and as previously described herein, the computing device may determine effective flow areas between individual virtual vanes and may determine the total effective flow area of the entire vane ring assembly. At 522, the computing device may determine individual effective flow areas between each of the vanes. At 524, the computing device may generate a virtual vane ring assembly by piecing together each of the virtual vanes into a comprehensive ring assembly. At 526, the computing device may determine a vane ring effective flow area, for example, by adding up the individual vane effective flow areas. At 528, the computing device may compare components or aspects of the virtual turbine to a reference turbine.

In the foregoing description, numerous specific details, examples, and scenarios are set forth in order to provide a more thorough understanding of the present disclosure. It will be appreciated, however, that embodiments of the disclosure may be practiced without such specific details. Further, such examples and scenarios are provided for illustration only, and are not intended to limit the disclosure in any way. Those of ordinary skill in the art, with the included descriptions, should be able to implement appropriate functionality without undue experimentation.

References in the specification to "an embodiment," etc., indicate that the embodiment described may include a particular feature, structure, or characteristic. Such phrases are not necessarily referring to the same embodiment. Further, when a particular feature, structure, or characteristic is described in connection with an embodiment, it is believed to be within the knowledge of one skilled in the art to effect such feature, structure, or characteristic in connection with other embodiments whether or not explicitly indicated.

Embodiments in accordance with the disclosure may be implemented in hardware, firmware, software, or any combination thereof. Embodiments may also be implemented as instructions stored using one or more machine-readable media which may be read and executed by one or more processors. A machine-readable medium may include any suitable form of volatile or non-volatile memory.

Modules, data structures, and the like defined herein are defined as such for ease of discussion, and are not intended to imply that any specific implementation details are required. For example, any of the described modules and/or data structures may be combined or divided in sub-modules, sub-processes or other units of computer code or data as may be required by a particular design or implementation of the computing device.

In the drawings, specific arrangements or orderings of elements may be shown for ease of description. However, the specific ordering or arrangement of such elements is not meant to imply that a particular order or sequence of processing, or separation of processes, is required in all embodiments. In general, schematic elements used to represent instruction blocks or modules may be implemented using any suitable form of machine-readable instruction, and each such instruction may be implemented using any suitable programming language, library, application programming interface (API), and/or other software development tools or frameworks. Similarly, schematic elements used to represent data or information may be implemented using any suitable electronic arrangement or data structure. Further, some connections, relationships, or associations between elements may be simplified or not shown in the drawings so as not to obscure the disclosure.

This disclosure is considered to be exemplary and not restrictive. In character, and all changes and modifications that come within the spirit of the disclosure are desired to be protected.

What is claimed is:

1. A computing device for determining an effective flow area of a vane segment for a turbine or a turbine engine, the computing device comprising a processor and instructions embodied in one or more non-transitory machine accessible storage media, the instructions executable by the processor to cause the computing device to:
    optically scan the vane segment that includes a first vane and a second vane;
    create a virtual vane segment comprising a first virtual vane corresponding to the first vane and a second virtual vane corresponding to the second vane based on the optical scan;
    determine at least one chokepoint of the virtual vane segment by (i) sectioning the virtual vane segment into one or more sections and (ii) determining a distance across a flow area between an edge of the first virtual vane and an edge of the second virtual vane for each of the one or more sections, wherein the at least one chokepoint comprises a point of the first virtual vane and a point of the second virtual vane that restrict a flow area between the first virtual vane and the second virtual vane;
    calculate a virtual vane segment effective flow area based at least in part on the at least one chokepoint; and
    determine an effective flow area of the vane segment based on the virtual vane segment effective flow area.

2. The computing device of claim 1, wherein the instructions cause the computing device to compare the virtual vane segment effective flow area to a reference vane segment effective flow area.

3. The computing device of claim 1, wherein the optical scan comprises a blue light scan.

4. The computing device of claim 1, wherein the optical scan comprises a front scan and a back scan.

5. The computing device of claim 1, wherein the instructions cause the computing device to store the virtual vane segment and virtual vane segment effective flow area in a library.

6. The computing device of claim 1, wherein the instructions cause the computing device to determine the effective flow area of the vane segment by:
- optically scanning the first vane;
- optically scanning the second vane;
- creating the first virtual vane based on the optical scanning of the first vane; and
- creating the second virtual vane based on the optical scanning of the second vane.

7. The computing device of claim 6, wherein the instructions cause the computing device to create the virtual vane segment based on the first virtual vane and the second virtual vane.

8. The computing device of claim 6, wherein the instructions cause the computing device to store the first virtual vane, the second virtual vane, and the virtual vane segment effective flow area in a library.

9. A computing device for determining an effective flow area of a vane ring for a turbine or a turbine engine, the computing device comprising a processor and instructions embodied in one or more non-transitory machine accessible storage media, the instructions executable by the processor to cause the computing device to:
- determine an effective flow area of the vane ring by:
  - optically scanning the vane ring that includes a plurality of vanes;
  - based on the optical scanning, creating a virtual vane ring comprising a plurality of virtual vanes corresponding to each of the plurality of vanes, wherein the plurality of virtual vanes defines a plurality of virtual vane segments;
  - determining at least one chokepoint for each of the plurality of virtual vane segments, wherein the at least one chokepoint comprises a point that limits a flow area between virtual vanes of the virtual vane segment, and wherein determining the at least one chokepoint comprises (i) sectioning each virtual vane segment into one or more sections and (ii) for each of the one or more sections, determining a distance across the flow area between edges of the virtual vanes of the virtual vane segment;
  - calculating an individual effective flow area of each of the plurality of virtual vane segments based at least in part on the at least one chokepoint; and
  - calculating a vane ring effective flow area by calculating a sum of the individual effective flow areas.

10. The computing device of claim 9, wherein optically scanning the vane ring comprises individually scanning each of the plurality of vanes.

11. The computing device of claim 9, wherein the instructions cause the computing device to store each of the plurality of virtual vanes in a library.

12. The computing device of claim 9, wherein the instructions cause the computing device to compare at least one of the plurality of virtual vanes to a reference virtual vane.

13. The computing device of claim 12, wherein the instructions cause the computing device to output an alert if the compared virtual vane is outside of a preset tolerance from the reference virtual vane.

14. The computing device of claim 9, wherein the instructions cause the computing device to compare at least one of the individual effective flow areas to a reference effective flow area.

15. The computing device of claim 14, wherein the instructions cause the computing device to output an alert if the compared individual effective flow area is outside of a preset tolerance from the reference effective flow area.

16. The computing device of claim 9, wherein the instructions cause the computing device to:
- compare the vane ring effective flow area to a reference vane ring effective flow area; and
- output an alert if the vane ring effective flow area is outside of a preset tolerance from a reference vane ring effective flow area.

17. A method comprising:
- determining, by a computing device comprising a processor and instructions embodied in one or more non-transitory machine accessible storage media, an effective flow area of a vane segment for a turbine or a turbine engine by:
- optically scanning, by the computing device, the vane segment, wherein the vane segment comprises a first airfoil and a second airfoil;
- creating, by the computing device, a virtual vane segment based on the optical scanning, wherein the virtual vane segment comprises a first virtual airfoil corresponding to the first airfoil and a second virtual airfoil corresponding to the second airfoil;
- determining, by the computing device, at least one chokepoint of the virtual vane segment, wherein the at least one chokepoint comprises a point of the first virtual airfoil and a point of the second virtual airfoil that restrict a flow area between the first virtual airfoil and the second virtual airfoil, and wherein determining the at least one chokepoint comprises (i) sectioning the virtual vane segment into one or more sections and (ii) for each of the one or more sections, determining a distance across the flow area between an edge of the first virtual airfoil and an edge of the second virtual airfoil; and
- calculating, by the computing device, a virtual vane segment effective flow area based at least in part on the at least one chokepoint.

18. The method of claim 17, further comprising comparing, by the computing device, the virtual vane segment effective flow area to a reference effective flow area.

19. The method of claim 18, further comprising determining, by the computing device, whether the virtual vane segment effective flow area is outside of a preset tolerance from the reference effective flow area.

20. The method of claim 19, further comprising repairing or replacing the vane segment in response to determining that the virtual vane segment effective flow area is outside of the preset tolerance from the reference effective flow area.

* * * * *